United States Patent [19]

Sunano

[11] Patent Number: 5,097,384
[45] Date of Patent: Mar. 17, 1992

[54] BATTERY POWERED APPARATUS HAVING DATA STORAGE CIRCUITS AND POWER OFF SWITCH AUTOMATICALLY ACTUATED BY OPENING OF REPLACEABLE BATTERY COMPARTMENT DOOR

[75] Inventor: Hironori Sunano, Nara, Japan
[73] Assignee: Sharp Kabushiki Kaisha, Japan
[21] Appl. No.: 598,815
[22] Filed: Oct. 16, 1990

Related U.S. Application Data

[63] Continuation of Ser. No. 421,814, Oct. 16, 1989, abandoned.

Foreign Application Priority Data

Oct. 18, 1988 [JP] Japan ............... 63-135589[U]

[51] Int. Cl.⁵ .................................. H02B 1/00
[52] U.S. Cl. .................. 361/380; 200/50 A; 361/331
[58] Field of Search ............ 200/50 A; 361/380, 331, 361/339, 392, 394, 395, 399, 415

[56] References Cited

U.S. PATENT DOCUMENTS 4,792,650 12/1988 Iwai ................. 200/50 A
4,073,000 2/1978 Krejsa ............... 200/50 A

OTHER PUBLICATIONS

English Abstract for prior Laid-Open Japanese Application—Pub. No. 59-144,924.
English Abstract for prior Laid-Open Japanese Application—Pub. No. 60-129,858.

Primary Examiner—Gregory D. Thompson
Attorney, Agent, or Firm—Nixon & Vanderhye

[57] ABSTRACT

A small-sized electronic apparatus having one or more replaceable batteries housed in a battery compartment of the body of the apparatus, wherein the apparatus comprises: a cover which is moved to open or close the battery compartment; a switching member for switching on and off the power source; and a linking member to which the switching member is attached and which is moved with the movement of the cover to allow the switching member to turn off the power source when the cover is moved to open the battery compartment, whereby the power is automatically turned off when the cover for the battery compartment is opened, so that there is no possibility of the stored data being lost or distorted even if the user tries to replace the battery without turning off the power switch.

8 Claims, 2 Drawing Sheets

BATTERY POWERED APPARATUS HAVING DATA STORAGE CIRCUITS AND POWER OFF SWITCH AUTOMATICALLY ACTUATED BY OPENING OF REPLACEABLE BATTERY COMPARTMENT DOOR

This is a continuation of application Ser. No. 07/421,814, filed Oct. 16, 1989, now abandoned.

BACKGROUND OF THE INVENTION

1. Field of the Invention

The present invention relates to a small-sized electronic apparatus such as an electronic organizer used for storing data, and more particularly, to a small-sized electronic apparatus having one or more replaceable batteries housed in the body of the electronic apparatus.

2. Description of the prior art

A small-sized electronic apparatus such as electronic organizer used for storing data is usually operated by one or more replaceable batteries. In such an electronic apparatus, if the battery or batteries are removed from the body of the apparatus with the normally used power switch left on and hence in a data-write enabled state, the data previously stored in the apparatus may be lost or distorted. It is therefore required to turn off the power switch before removing the battery or batteries to protect the stored data. However, in the case of a conventional electronic apparatus, cautions are only given in instruction manuals or the like, instructing the user to turn off the power switch before removing the battery or batteries. In such a circumstance, the user may forget to turn off the usual power switch when replacing the battery or batteries and may remove the battery or batteries from the body of the apparatus with the power switch left on and hence in a data-write enabled state, thereby causing the stored data to be lost or distorted.

SUMMARY OF THE INVENTION

The small-sized electronic apparatus of this invention, which overcomes the above-discussed and numerous other disadvantages and deficiencies of the prior art, has one or more replaceable batteries housed in a battery compartment of the body of the apparatus, and comprises a cover which is moved to open or close said battery compartment, a switching member (in addition to the usual power switch) for switching on and off the power source, and a linking member to which said switching member is attached and which is moved with the movement of said cover to allow said switching member to turn off the power source when said cover is moved to open said battery compartment.

In a preferred embodiment, the cover is slidable with respect to said body.

In a preferred embodiment, the linking member is slidable in the same direction as the sliding direction of said cover, said linking member sliding together with said cover when said cover is slid in such a direction as to open said battery compartment.

In a preferred embodiment, the cover is swingable with respect to said body.

In a preferred embodiment, when the cover is swung in such a direction as to open said battery compartment, the linking member is pressed by said cover so as to slide.

Thus, the invention described herein makes possible the objective of providing a small-sized electronic apparatus in which the power is automatically turned off when the cover for the battery compartment is opened, so that there is no possibility of the stored data being lost or distorted even if the user tries to replace the battery without turning off the usual user-operated power switch.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
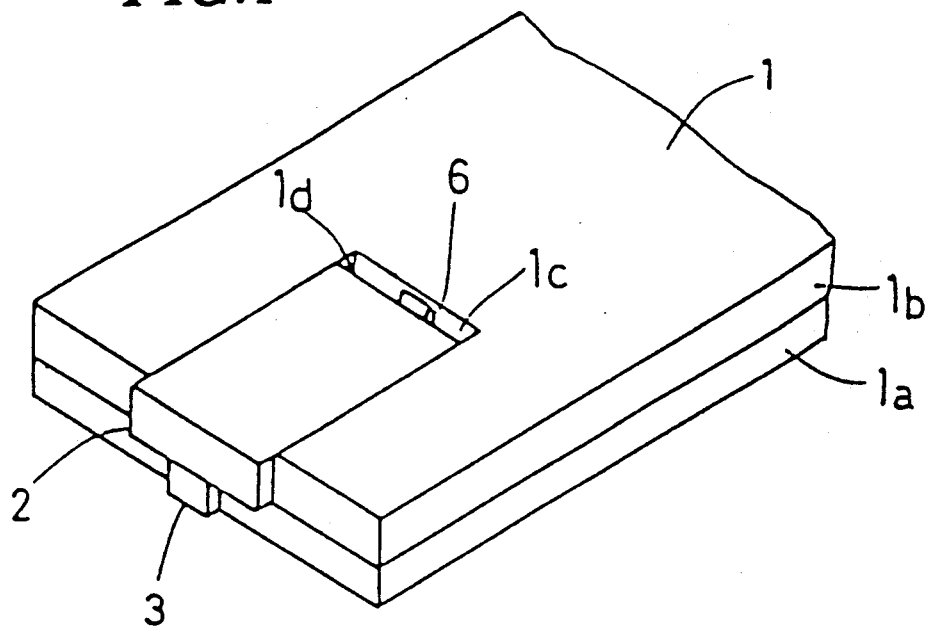
FIG. 1 is a perspective view showing the rear side of a small-sized electronic apparatus of the present invention.
Figure 2:
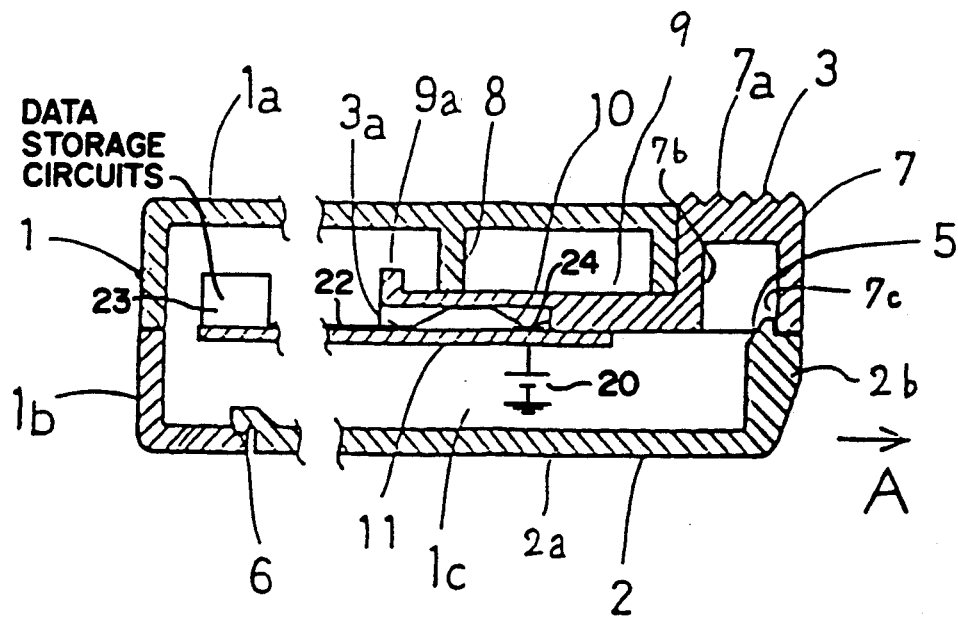
FIG. 2 is a cross-sectional view of the small-sized electronic apparatus of the invention.

FIG. 1 is a perspective view showing the rear side of a small-sized electronic apparatus of the invention used for storing data. The small-sized electronic apparatus has a body 1 housing electronic components and the like. The body 1 includes an upper cabinet 1a and a lower cabinet 1b, the cabinets being engaged with each other. As shown in FIG. 2, a battery compartment 1c for holding a replaceable battery 20 is provided within the lower cabinet 1b of the body 1. The battery compartment 1c has an opening formed at the bottom of the lower cabinet 1b and an opening formed in the central portion of one side of the lower cabinet 1b, the two openings being formed continuously.

The openings of the battery compartment 1c is closed or opened with a cover 2. The cover 2 consists of a bottom part 2a which covers the opening formed at the bottom of the lower cabinet 1b, and an end part 2b which is formed continuously with and perpendicular to one end of the bottom part 2a to cover the opening formed on the side of the lower cabinet 1b. The battery compartment 1c includes side walls extending perpendicularly from the opening formed on the side of the lower cabinet 1b. The bottom part 2a of the cover 2 engages a slide groove 1d provided on each of the side walls for sliding thereon as shown in FIG. 1.

The bottom part 2a of the cover 2 is provided with an engaging pawl 6 at one end thereof, the end being opposite to the one having the end part 2b. When the cover 2 is placed in position to close the battery compartment 1c, the engaging pawl 6, which is provided with flexibility, engages a recessed portion 1e formed on the inner surface of the battery compartment 1c of the lower cabinet 1b, thereby fixing the cover 2 to the lower cabinet 1b. When the engaging pawl 6 is disengaged from the recessed portion 1e, the cover 2 becomes slidable to open the battery compartment 1c. Formed on is an upwardly extending projection 5.

The battery compartment 1c formed in the lower cabinet 1b is separated from the inside of the upper cabinet 1a by a circuit board 11. The circuit board 11 has a circuit pattern 22 formed on the side thereof facing the inner surface o±the upper cabinet 1a to power data storage circuits 23. A linking member 3 is disposed in such a way as to slide along the circuit pattern of the circuit board 11. The linking member 3 comprises a slide section 9 formed parallel to the circuit pattern 22 of the circuit board 11, and a link section 7 formed in continuous relationship with one end of the slide section 9. The link section 7 extends outwardly from the upper cabinet 1a in such a way as to face the end part 2b of the cover 2 which covers the battery compartment 1c. The link section 7 consists of a side portion 7b extending upwardly from the end of the slide section 9, an upper surface 7a formed in continuous relationship with the upper end of the side portion 7b and approximately flush with the upper surface of the upper cabinet 1a, and an outer portion 7c extending downwardly from the other end of the upper surface 7a. The upper surface 7a of the link section 7 is formed in a corrugated shape. In this way, the link section 7 has a U-shaped cross section with an opening facing the lower cabinet 1b. The lower end of the outer portion 7c is positioned to abut against the upper end face of the end part 2b of the cover 2 placed in position to close the battery compartment 1c, the lower end of the outer portion 7c thus engaging the projection 5 of the cover 2. In this construction, when the cover 2 is slid to open the battery compartment 1c, the linking member 3 is also slid in the same direction together with the cover 2.

Figure 3:
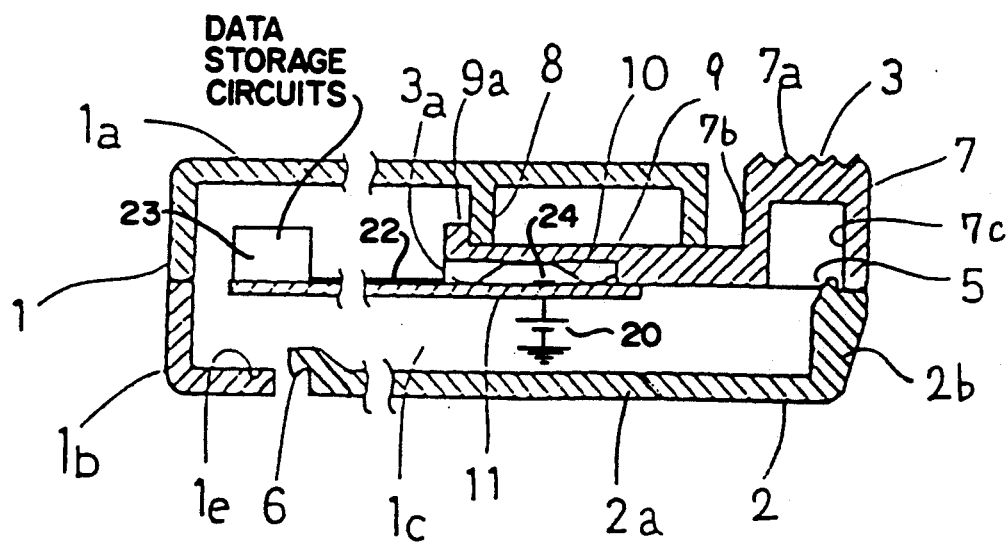
FIG. 3 is a cross-sectional view of the small-sized electronic apparatus at the time when a cover is slid to open a battery compartment.

The slide section 9 of the linking member 3 is provided with an upwardly protruding stopper 9a on the end thereof positioned inside the upper cabinet 1a. When the linking member 3 is slid a given distance together with the cover 2 which is slid to open the battery compartment 1c, the stopper 9a abuts against a rib 8 protruding from the inner surface of the upper cabinet 1a to stop the sliding movement of the entire linking member 3 as shown in FIG. 3. Also, the slide section 9 includes a recessed section 3a formed therein facing a designated portion of the circuit pattern of the circuit board 11. A switching member 10 is disposed inside the recessed section 3a. When the linking member 3 engages the cover 2 placed in position to close the battery compartment 1c as shown in FIG. 2, the switching member 10 is in contact with a designated power supply pattern in the circuit pattern 24 of the circuit board 11 to turn on the power source of the circuit pattern 22. On the other hand, when the linking member 3 is slid together with the cover 2 until the stopper 9a abuts against the rib 8 to stop the sliding movement as shown in FIG. 3, the switching member 10 is removed from contact with the power supply pattern 24 and so turns off the power source of the circuit patter 22.

For the replacement of the battery, the linking member 3 is slid in the direction of arrow A until the stopper 9a abuts against the rib 8. The cover 2 is then removed from the lower cabinet 1b so that the battery 20 in the battery compartment 1c can be replaced with a new one. After completion of the replacement, the projection 5 formed on the end part 2b of the cover 2 is placed back into the opening of the linking member 3, and the linking member 3 is slid in the opposite direction to allow the cover 2 to slide back until the engaging pawl 6 of the cover 2 engages the recessed portion 1e of the lower cabinet 1b, the battery compartment 1c thus being closed with the cover 2 fixed to the lower cabinet 1b. The linking member 3 is slid by the user pressing the corrugated upper surface 7a.

In the small-sized electronic apparatus constructed as described above, when the cover 2 is placed in position to close the battery compartment 1c with a battery 20 housed therein, the projection 5 formed on the upper end face of the end part 2b of the cover 2 engages the lower end of the outer portion 7c of the link section 7 of the linking member 3. In this state, the switching member 10 disposed on the end of the slide section 9 of the linking member 3 is in contact with the power supply pattern 24 on the circuit board 11 to close the power circuit.

To replace the battery 20 housed in the battery compartment 1c, the inner end portion of the bottom part 2a of the cover 2 is pressed toward the inside of the lower cabinet 1b to disengage the engaging pawl 6 of the cover 2 from the recessed portion 1e of the lower cabinet 1b. The cover 2 is then slid in the direction of arrow A shown in FIG. 2 to open the battery compartment 1c. At this time, since the projection 5 of the end part 2b of the cover 2 engages the link section 7 of the linking member 3, the linking member 3 is also slid together with the cover 2 in the same direction. The cover 2 is slid out until the stopper 9a formed on the end of the slide section 9 of the linking member 3 stops to abut against the rib 8 as shown in FIG. 3, the cover 2 being then removed from the lower cabinet 1b to open the battery compartment 1c. When the stopper 9a of the slide section 9 of the linking member 3 stops to engage the rib 8, the switching member 10 provided at the end of the slide section 9 is removed from contact with the power supply pattern 24 on the circuit board 11 and so turns off the normally used power source of the circuit board 11. In this state, the battery 20 housed in the battery compartment 1c is replaced with a new one.

Thus, in the small-sized electronic apparatus of the present invention, even if the user tries to replace the battery 20 without turning off the power switch, the power is automatically turned off when the cover 2 of the battery compartment 1c is slid for replacement of the battery 20. Thus, there is no possibility of the stored data in data storage circuits of the apparatus associated with circuit pattern 22 on circuit board 11 being lost or distorted at the time of the replacement of the battery 20.

Figure 4:
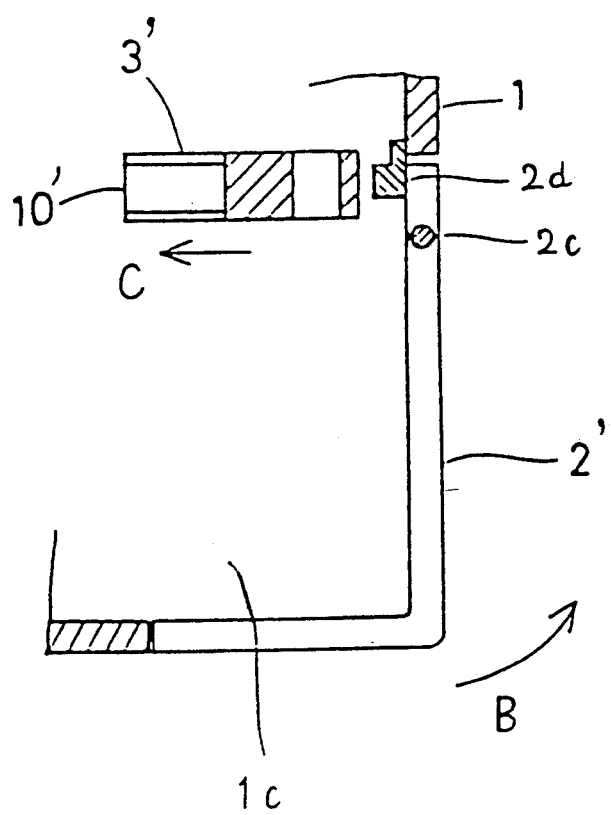
FIG. 4 is a cross-sectional view of another small-sized electronic apparatus of the present invention, illustrating the vicinity of a battery compartment.

FIG. 4 shows another small-sized electronic apparatus of the present invention, in which a cover 2' for opening and closing the battery compartment 1c is mounted to the body 1 in such a way that it can swing about a fulcrum 2c. When the cover 2' is swung in the direction of arrow B to open the battery compartment 1c, a pressing member 2d attached to the cover 2' is pressed against a linking member 3', the linking member 3' then being slid in the direction of arrow C. A switching member 10' is provided at the end of the linking member 3'. In the same manner as in the foregoing example, the switching member 10' comes out of contact with the power supply pattern on the circuit board to turn off the power when the linking member 3' is slid in the direction of arrow C. Thus, also in this example, even if the user tries to replace the battery with the power switch left on, the power is automatically turned off when the cover 2' is swung to open the battery compartment 1c, so that there is no possibility of the stored data being lost or distorted.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A small-sized electronic apparatus for storing data and adapted to have one or more replaceable batteries used as a power source for the data storing apparatus housed in a battery compartment of the body of the apparatus, wherein said apparatus comprises:
   a cover which is movable to open and close said battery compartment;
   a switching member for switching on and off the power source to said data storing apparatus; and
   a linking member to which said switching member is attached and which is moved with movement of said cover to cause said switching member to turn off the power source to said data storage apparatus when said cover is moved to open said battery compartment thereby preventing destruction of data stored in the apparatus during battery replacement.

2. A small-sized electronic apparatus according to claim 1, wherein said cover is slidable with respect to said body.

3. A small-sized electronic apparatus according to claim 2, wherein said linking member is slidable together with said cover when said cover is slid in a direction to open said battery compartment.

4. A small-sized electronic apparatus according to claim 1, wherein said cover is swingable about a pivot axis with respect to said body.

5. A small-sized electronic apparatus according to claim 4, wherein when said cover is configured to press against said linking member and to slide said linking member when the cover is swung to open said battery compartment.

6. A battery operated data storing apparatus comprising:
   data storage circuits;
   a battery compartment having an opening door to permit battery replacement; and
   power supply circuit patterns for electrically connecting a battery in the battery compartment to power said data storage circuits;
   said power supply circuit patterns are automatically disconnected from a power supply when the battery compartment door is opened thereby preventing destruction of data stored in said data storage circuits during battery replacement.

7. A battery operated data storing apparatus as in claim 6 further comprising a switching member bridging said power supply circuit patterns and a power supply, said switching member electrically connecting said power supply circuit patterns to a power supply when the battery compartment door is closed but said switching member is automatically slid away from said power supply circuit patterns when the door is opened so as to automatically disconnect said power supply circuit patterns from a power supply.

8. A battery operated data storing apparatus as in claim 7 further comprising a slidable link member which carries said switching member therewithin and which slidably interconnects said battery compartment door with the rest of said apparatus.

* * * * *